United States Patent
Fan

(10) Patent No.: US 9,324,651 B1
(45) Date of Patent: Apr. 26, 2016

(54) PACKAGE STRUCTURE

(71) Applicant: Powertech Technology Inc., Hsinchu County (TW)

(72) Inventor: Wen-Jeng Fan, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 14/574,408

(22) Filed: Dec. 18, 2014

(51) Int. Cl.
*H01L 23/02* (2006.01)
*H01L 23/522* (2006.01)
*H01L 23/00* (2006.01)

(52) U.S. Cl.
CPC ............ *H01L 23/5226* (2013.01); *H01L 24/49* (2013.01); *H01L 2924/183* (2013.01)

(58) Field of Classification Search
USPC ......... 257/676, 678, 686, 697, 698, 712, 738, 257/774, 778, 782; 438/107
See application file for complete search history.

(56) References Cited

U.S. PATENT DOCUMENTS

2006/0091542 A1* 5/2006 Zhao et al. .................... 257/738
2014/0175633 A1* 6/2014 Lin et al. ....................... 257/712

* cited by examiner

*Primary Examiner* — Errol Fernandes
(74) *Attorney, Agent, or Firm* — Jianq Chyun IP Office

(57) ABSTRACT

A package structure includes a chip, a substrate, wires and a molding compound. The chip includes an active surface, a back surface and bonding pads disposed on the active surface. The substrate includes first and second solder masks, first and second patterned circuit layers and a core layer having a first surface and a second surface. The first patterned circuit layer is disposed on the first solder mask. The core layer disposed on the first solder mask with the first surface partially exposes the first patterned circuit layer. The substrate disposed on the active surface with the first solder mask exposes the bonding pads. The second patterned circuit layer disposed on the second surface. The second solder mask partially covers the second patterned circuit layer. The wires are connected between the first patterned circuit layer and the bonding pads. The molding compound covers the chip, the wire and the substrate.

14 Claims, 2 Drawing Sheets

PACKAGE STRUCTURE

BACKGROUND OF THE INVENTION

1. Field of the Invention

The present invention generally relates to a package structure. More particularly, the present invention relates to a package structure of a chip.

2. Description of Related Art

Modern electronic equipment relies heavily on printed circuit boards on which semiconductor chips, or integrated circuits (ICs), are mounted. The mechanical and electrical connections between the chip and the substrate have posed challenges for chip designers. Three well known techniques for interconnecting the IC to the substrate are: wire bonding, tape automated bonding (TAB) and flip-chip.

A wire bonding technology is a common chip packaging technology applied to electrically connect a chip to a substrate. Here, the substrate is, for example, a circuit board. Generally, the wire bonding technology includes forming a stud bump in a wire bonding pad region of the substrate with use of a stud bump machine and extending wires upward with a distance. After that, the wires are moved downward to a chip pad region and are stitched. By applying the wire bonding technology, the chip and the substrate can be electrically connected to each other by means of the wires, and thereby signals can be transmitted between the chip and the substrate through the wires.

However, the chip disposed on the substrate is at a higher level than the upper surface of the substrate, so the loop height of the wires would give rise to an increase in the thickness of the package structure. Therefore, the package structure using wire bonding process is hard to meet the low-profile requirements.

SUMMARY OF THE INVENTION

Accordingly, the present invention is directed to a package structure which the overall thickness thereof is rather thin.

The present invention provides a package structure including at least one chip, at least one substrate, a plurality of wires and a molding compound. The chip includes a plurality of bonding pads, an active surface and a back surface opposite to the active surface. The bonding pads are disposed on the active surface. The substrate includes a first solder mask, a second solder mask, a first patterned circuit layer, a second patterned circuit layer and a core layer. The core layer has a first surface and a second surface opposite to the first surface. The first patterned circuit layer is disposed on the first solder mask. The core layer is disposed on the first solder mask with the first surface and exposes a part of the first patterned circuit layer. The substrate is disposed on the active surface of the chip with the first solder mask and exposes the bonding pads. The second patterned circuit layer is disposed on the second surface and electrically connected to the first patterned circuit layer, and the second solder mask partially covers the second patterned circuit layer. The wires are connected between the first patterned circuit layer exposed by the core layer and the bonding pads exposed by the first solder mask. The molding compound covers the chip, the wire and a part of the substrate.

According to an embodiment of the present invention, the package structure further includes a plurality of solder balls disposed on the second surface and electrically connected to the second patterned circuit layer exposed by the second solder mask.

According to an embodiment of the present invention, the package structure further includes a carrier. The chip is disposed on the carrier with the back surface.

According to an embodiment of the present invention, the package structure further includes an adhesive disposed between the chip and the carrier.

According to an embodiment of the present invention, a top surface of the molding compound is coplanar with a top surface of the second solder mask.

According to an embodiment of the present invention, wherein the substrate further includes a plurality of conductive vias configured to electrically connect the first patterned circuit layer and the second patterned circuit layer.

According to an embodiment of the present invention, a size of the first solder mask is greater than a size of the core layer.

According to an embodiment of the present invention, wherein a size of the chip is greater than a size of the first solder mask.

According to an embodiment of the present invention, the package structure further includes an adhesive disposed between the first solder mask and the chip.

According to an embodiment of the present invention, wherein the amounts of the chip and the substrate are respectively plural, and each of the substrates is disposed on the active surface of the corresponding chip with the corresponding first solder mask and exposes the corresponding bonding pads.

According to an embodiment of the present invention, wherein each of the wires is connected between the corresponding first patterned circuit layer exposed by the corresponding core layer and the bonding pad exposed by the corresponding first solder mask.

According to an embodiment of the present invention, wherein the package structure further includes a carrier. The chips are disposed on the carrier with the back surfaces.

According to an embodiment of the present invention, wherein the package structure further includes an adhesive disposed between the chips and the carrier.

According to an embodiment of the present invention, wherein the package structure further includes an adhesive disposed between the first solder masks and the corresponding chips.

Based on the description described above, in the package structure of the invention, the substrate is disposed on the chip and exposes the bonding pads of the chip. The substrate includes a first solder mask, a first patterned circuit layer and a core layer. The first patterned circuit layer is disposed on the first solder mask and the core layer is disposed on the first solder mask and exposes a part of the first patterned circuit layer. With the disposition described above, the wire is connected between the first patterned circuit layer exposed by the core layer and the bonding pads exposed by the substrate. Therefore, the level of the highest point of each wire would be lower then the level of the top surface of the substrate. As such, as long as the molding compound is coplanar with the top surface of the substrate, the molding compound can completely cover the wires without giving additional thickness to the package structure. Therefore, the overall thickness of the package structure can be reduced, and the requirements of low-profile package structure can be easily met.

BRIEF DESCRIPTION OF THE DRAWINGS

The accompanying drawings are included to provide a further understanding of the invention, and are incorporated in and constitute a part of this specification. The drawings

DESCRIPTION OF THE EMBODIMENTS

Figure 1:
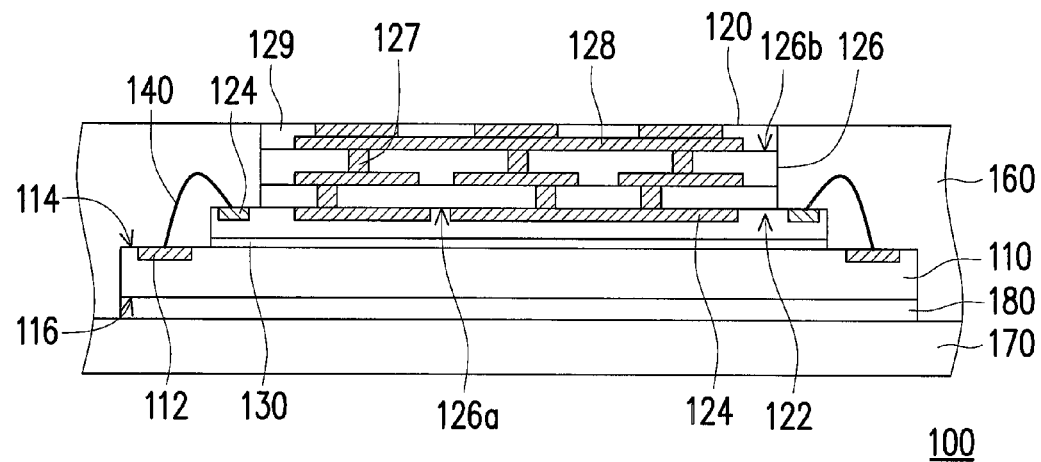
FIG. 1 is a cross-sectional view of a chip package according to an embodiment of the invention.

In the following detailed description of the preferred embodiments, reference is made to the accompanying drawings which form a part hereof, and in which are shown by way of illustration specific embodiments in which the invention may be practiced. In this regard, directional terminology, such as "top", "bottom", "front", "back", etc., is used with reference to the orientation of the Figure(s) being described. The components of the invention can be positioned in a number of different orientations. As such, the directional terminology is used for purposes of illustration and is in no way limiting. It is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. On the other hand, the drawings are only schematic and the sizes of components may be exaggerated for clarity. It is to be understood that other embodiments may be utilized and structural changes may be made without departing from the scope of the invention. Unless limited otherwise, the terms "connected", "coupled", and "mounted" and variations thereof herein are used broadly and encompass direct and indirect connections, couplings, and mountings. Accordingly, the drawings and descriptions will be regarded as illustrative in nature and not as restrictive.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a cross-sectional view of a chip package according to an embodiment of the invention. Referring to FIG. 1, in the present embodiment, a package structure 100 includes at least one chip 110, at least one substrate 120, a plurality of wires 140 and a molding compound 160. The chip 110 includes a plurality of bonding pads 112, an active surface 114 and a back surface 116 opposite to the active surface 114. The bonding pads 112 are disposed on the active surface 114. The substrate 130 includes a first solder mask 122, a first patterned circuit layer 124, a core layer 126, a second patterned circuit layer 128 and a second solder mask. The core layer 126 has a first surface 126a and a second surface 126b opposite to the first surface 126a. The first patterned circuit layer 124 is disposed on the first solder mask 122. The core layer 126 is disposed on the first solder mask 122 with its own first surface 126a and exposes a part of the first patterned circuit layer 124. In the present embodiment, the size of the first solder mask 122 is greater than the size of the core layer 126, such that the core layer 126 partially exposes the first patterned circuit layer 124 located on the first solder mask 122. Also, the size of the chip 110 is greater than the size of the first solder mask 122 such that the first solder mask 122 exposes the bonding pads 112 located on the active surface 114 of the chip 110. An adhesive 130 may be disposed between the first solder mask 122 and the chip 110, such that the substrate 120 is attached to the corresponding chip 110. The wires 140 are connected between the first patterned circuit layer 124 exposed by the core layer 126 and the bonding pads 112 exposed by the first solder mask 122 for electrically connecting the substrate 120 and the chip 110. In the present embodiment, the first and the second patterned circuit layers 124, 128 may be formed by build-up process, subtractive process, or semi-additive process, but, of course, the invention is not limited thereto.

In detail, the second patterned circuit layer 128 is disposed on the second surface 126b of the substrate 120, and the substrate 120 further includes a plurality of conductive vias 127, wherein the conductive vias 127 are configured to electrically connect the first patterned circuit layer 124 and the second patterned circuit layer 128. As such, the second patterned circuit layer 128 disposed on the second surface 126b of the core layer 126 can be electrically connected to the first patterned circuit layer 124 disposed on the first solder mask 122. The substrate 120 may be a single layer board or a multi-layer board. In the present embodiment, the substrate 120 is a multi-layer board as shown in FIG. 1, and the substrate 120 may includes more than just the first patterned circuit layer 124 and the second patterned circuit layer 128 but also other patterned circuit layers in between. As such, the conductive vias 127 are configured for connecting between the patterned circuit layers so as to electrically connect the first patterned circuit layer 124 and the second patterned circuit layer 128.

Figure 2:
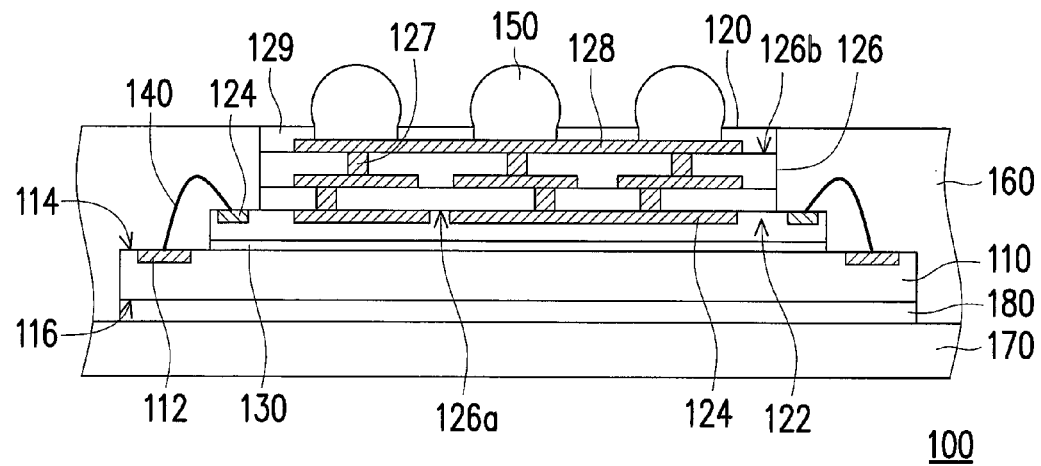
FIG. 2 is a cross-sectional view of a chip package according to another embodiment of the invention.

FIG. 2 is a cross-sectional view of a chip package according to another embodiment of the invention. It is noted that the chip package 100 shown in FIG. 2 contains many features same as or similar to the chip package 100 disclosed earlier with FIG. 1. For purpose of clarity and simplicity, detail description of same or similar features may be omitted. Herein, identical or similar elements are indicated with the same or similar reference number. Referring to FIG. 2, the main differences between the chip package 100a shown in FIG. 2 and the chip package 100 shown in FIG. 1 are that, in the present embodiment, the package structure 100 may further includes a plurality of solder balls 150. The solder balls 150 are disposed on the second surface 126b and electrically connected to the second patterned circuit layer 128. The molding compound 160 covers and encapsulates the chip 110, the wire 140 and a part of the substrate 120 and exposes the solder balls 150, so the package structure 100 may be electrically connected to another electronic device through the solder balls 150. In the present embodiment, the molding compound 160 may be epoxy molding compound. In other words, the material of the molding compound 160 may include epoxy resin, but the invention is not limited thereto.

Referring to FIG. 1 and FIG. 2, the package structure 100 may further include a carrier 170 and an adhesive 180, the chip 110 is disposed on the carrier 170 with its own back surface 116, and the adhesive 180 is disposed between the chip 110 and the carrier 170 for adhering the chip 110 to the carrier 160. The second solder mask 129 covers a part of the second patterned circuit layer 128 and exposes the solder balls 150.

In detail, a top surface of the second solder mask 129 may be coplanar with a top surface of the molding compound 160. Since the wires 140 are connected from the first patterned circuit layer 124 on the first solder mask 122 down to the bonding pads 112 of the chip, the level of the highest point of each wire 140 would be lower then the level of the top surface of the second solder mask 129. Therefore, the molding compound 160 can be coplanar with the top surface of the second solder mask 129 to cover the wires 140 without giving additional thickness to the package structure 100. In the present embodiment, the carrier 160 is, for example, a printed circuit board. In other embodiment, however, the carrier 170 may also be a heat sink or a package carrier which can be removed after the molding compound 160 is molded to cover the chips 110, the wires 140 and a part of the substrates 120, so that the overall thickness of the package structure 100 can be further reduced.

With the disposition described above, the first solder mask 122 of the substrate 120 with the first patterned circuit layer 124 located thereon is disposed on the chip 110 and exposes the bonding pads 112 of the chip 110. The core layer 126 of the substrate 120 is disposed on the first solder mask 122 and exposes a part of the first patterned circuit layer 124. Accordingly, the wire is connected between the first patterned circuit layer 124 exposed by the core layer 126 and the bonding pads 112 of the chip 110 exposed by the first solder mask 122. Therefore, the level of the highest point of each wire 140 would be lower then the level of the top surface of the substrate 120. Therefore, the molding compound 160 can be coplanar with the top surface of the second solder mask 190 to cover the wires 140 without giving additional thickness to the package structure 100. Therefore, the overall thickness of the package structure 100 can be reduced, so as to meet the requirements of low-profile package structure.

Figure 3:
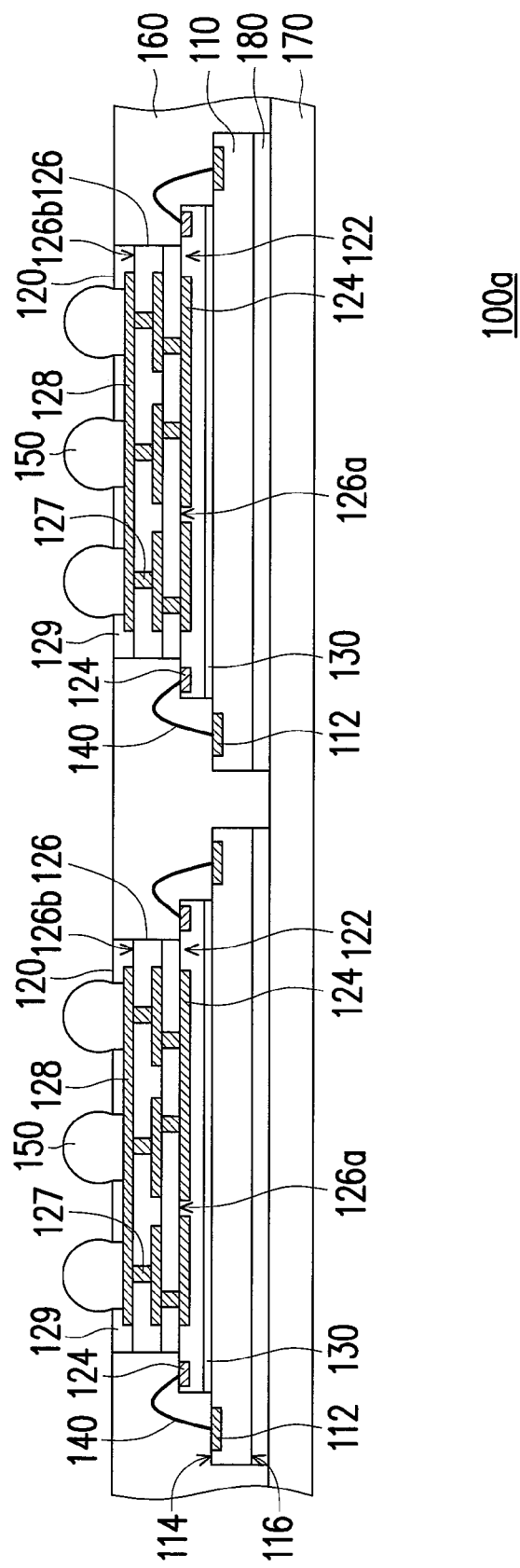
FIG. 3 is a cross-sectional view of a chip package according to another embodiment of the invention.

FIG. 3 is a cross-sectional view of a chip package according to another embodiment of the invention. It is noted that the chip package 100a shown in FIG. 3 contains many features same as or similar to the chip package 100 disclosed earlier with FIG. 2. For purpose of clarity and simplicity, detail description of same or similar features may be omitted. Herein, identical or similar elements are indicated with the same or similar reference number. Referring to FIG. 3, the main differences between the chip package 100a shown in FIG. 3 and the chip package 100 shown in FIG. 2 are that, in the present embodiment, the amount of chip 110 is plural (two are illustrated herein). Accordingly, the amounts of the substrate 120 are also plural.

In the present embodiment, each of the substrate 120 is disposed on the active surface 114 of the corresponding chip 110 with its own first solder masks 120 and exposes the corresponding bonding pads 112. In the present embodiment, the size of each chip 110 is greater than the size of each substrate 120, such that the substrates 120 can expose the bonding pads 112 of the corresponding chips 110. An adhesive 130 may be disposed between the first solder masks 122 and the chips 110, such that the substrates 120 are attached to the corresponding chips 110. Each of the wires 140 is connected between the corresponding first patterned circuit layer 124 exposed by the corresponding core layer 126 and the bonding pad 112 exposed by the corresponding first solder mask 122 for electrically connecting the substrates 130 and the corresponding chips 110.

Similar to the previous embodiment shown in FIG. 1 and FIG. 2, a top surface of each of the second solder masks 129 may be coplanar with a top surface of the molding compound 160. As such, since the wires 140 are connected from the first patterned circuit layer 124 on the first solder mask 120 down to the bonding pads 112 of the chip, the level of the highest point of each wire 140 would be lower then the level of the top surface of substrate 120, which is the upper surface of the second solder mask 129, so the molding compound 160 can cover the wires 140 without giving any additional thickness to the package structure 100a.

In the present embodiment, an adhesive 180 is disposed between the chips 110 and the carrier 170, such that the chips 110 are disposed on and attached to the carrier 170 with their own back surfaces 116. In the present embodiment, the carrier 170 is, for example, a printed circuit board. In other embodiment, however, the carrier 170 may also be a heat sink or a package carrier which can be removed after the molding compound 160 is molded to cover the chips 110, the wires 140 and a part of the substrate 120, so that the overall thickness of the package structure 100a can be further reduced.

In sum, in the package structure of the invention, the substrate is disposed on the chip with its own first solder mask and exposes the bonding pads of the chip. The first patterned circuit layer is disposed on the first solder mask. The core layer of the substrate is disposed on the first solder mask and electrically connected to the first patterned circuit layer. With the disposition described above, the wires are connected between the first patterned circuit layer exposed by the core layer and the bonding pads exposed by the first solder mask to electrically connect the substrate and the chip. Therefore, the level of the highest point of each wire would be lower then the level of the top surface of the substrate. As such, the molding compound can be coplanar with the top surface of the substrate to completely cover the wires without giving additional thickness to the package structure. Therefore, the overall thickness of the package structure can be reduced, so as to meet the requirements of low-profile package structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A package structure, comprising:
   at least one chip comprising a plurality of bonding pads, an active surface and a back surface opposite to the active surface, the bonding pads disposed on the active surface;
   at least one substrate comprising:
     a first solder mask;
     a first patterned circuit layer disposed on the first solder mask;
     a core layer having a first surface and a second surface opposite to the first surface, the core layer disposed on the first solder mask with the first surface and exposing a part of the first patterned circuit layer;
     a second patterned circuit layer disposed on the second surface and electrically connected to the first patterned circuit layer; and
     a second solder mask partially covering the second patterned circuit layer;
   a plurality of wires connected between the first patterned circuit layer exposed by the core layer and the bonding pads exposed by the first solder mask; and
   a molding compound covering the chip, the wire and a part of the substrate.

2. The package structure as claimed in claim 1, further comprising a plurality of solder balls disposed on the second surface and electrically connected to the second patterned circuit layer exposed by the second solder mask.

3. The package structure as claimed in claim 1, further comprising a carrier, wherein the chip is disposed on the carrier with the back surface.

4. The package structure as claimed in claim 3, further comprises an adhesive disposed between the chip and the carrier.

5. The package structure as claimed in claim 1, wherein a top surface of the molding compound is coplanar with a top surface of the second solder mask.

6. The package structure as claimed in claim 1, wherein the substrate further comprises a plurality of conductive vias configured to electrically connect the first patterned circuit layer and the second patterned circuit layer.

7. The package structure as claimed in claim 1, wherein a size of the first solder mask is greater than a size of the core layer.

8. The package structure as claimed in claim 1, wherein a size of the chip is greater than a size of the first solder mask.

9. The package structure as claimed in claim 1, further comprising an adhesive disposed between the first solder mask and the chip.

10. The package structure as claimed in claim 1, wherein the amounts of the at least one chip and the at least one substrate are respectively plural, and each of the substrates is disposed on the active surface of the corresponding chip with the corresponding first solder mask and exposes the corresponding bonding pads.

11. The package structure as claimed in claim 10, wherein each of the wires is connected between the corresponding first patterned circuit layer exposed by the corresponding core layer and the bonding pad exposed by the corresponding first solder mask.

12. The package structure as claimed in claim 10, further comprising a carrier, wherein the chips are disposed on the carrier with the back surfaces.

13. The package structure as claimed in claim 10, further comprises an adhesive disposed between the chips and the carrier.

14. The package structure as claimed in claim 10, further comprises an adhesive disposed between the first solder masks and the corresponding chips.

\* \* \* \* \*